(12) United States Patent
Ren et al.

(10) Patent No.: US 11,848,644 B2
(45) Date of Patent: Dec. 19, 2023

(54) RESISTOR-CAPACITOR OSCILLATION CIRCUIT

(71) Applicant: LANSUS TECHNOLOGIES INC., Shenzhen (CN)

(72) Inventors: Xiaojiao Ren, Shenzhen (CN); Jiashuai Guo, Shenzhen (CN)

(73) Assignee: LANSUS TECHNOLOGIES INC., Shenzhen (CN)

( * ) Notice: Subject to any disclaimer, the term of this patent is extended or adjusted under 35 U.S.C. 154(b) by 0 days.

(21) Appl. No.: 18/131,872

(22) Filed: Apr. 7, 2023

(65) Prior Publication Data

US 2023/0253920 A1 Aug. 10, 2023

Related U.S. Application Data

(63) Continuation of application No. PCT/CN2022/078379, filed on Feb. 28, 2022.

(30) Foreign Application Priority Data

Nov. 5, 2021 (CN) .......................... 202111302765.7

(51) Int. Cl.
*H03B 5/20* (2006.01)
*H03K 3/037* (2006.01)
(Continued)

(52) U.S. Cl.
CPC ................. *H03B 5/20* (2013.01); *H03B 5/06* (2013.01); *H03B 5/08* (2013.01); *H03K 3/037* (2013.01); *H03K 5/135* (2013.01); *H03K 19/20* (2013.01)

(58) Field of Classification Search
CPC .. H04L 7/033; H03B 5/20; H03B 5/06; H03B 5/04; H03B 5/08; H03K 3/037; H03K 19/20; H03K 5/135; H03K 5/1565
(Continued)

(56) References Cited

U.S. PATENT DOCUMENTS

| | | |
|---|---|---|
| 5,532,653 A | 7/1996 | Adkins |
| 5,889,441 A | 3/1999 | Inn |
| 2020/0153388 A1 | 5/2020 | Nielsen |

FOREIGN PATENT DOCUMENTS

| | | |
|---|---|---|
| CN | 103401553 A | 11/2013 |
| CN | 206698185 U | 12/2017 |

(Continued)

OTHER PUBLICATIONS

Yao Ruohe et al.: "A New Kind of Ring Oscillator Structure", «Journal of South China University of Technology (Natural Science Edition)», pp. 67-74, issuing date on May 15, 2020.

*Primary Examiner* — Arnold M Kinkead

(57) ABSTRACT

A resistor-capacitor oscillation circuit includes a first group of inverters, a second group of inverters, a latch, a delay circuit, and a third group of inverters. The first group of the inverters is connected to the delay circuit and is configured to generate a first signal A and a second signal B. An input end of the second group of the inverters is connected to an enable signal EN. An output end of the second group of the inverters is connected to the latch. An output end of the delay circuit is connected to the latch. The latch is connected to the third group of the inverters and includes a first output end and a second output end. After a first clock signal FB is driven by the third group of the inverters, an output signal CLK is output by an output end of the third group.

10 Claims, 3 Drawing Sheets

(51) Int. Cl.
*H03K 19/20* (2006.01)
*H03B 5/06* (2006.01)
*H03B 5/08* (2006.01)
*H03K 5/135* (2006.01)

(58) Field of Classification Search
USPC .................. 327/291, 293; 331/143, 135, 111
See application file for complete search history.

(56) References Cited

FOREIGN PATENT DOCUMENTS

| | | | | |
|---|---|---|---|---|
| CN | 111756328 A | 10/2020 | | |
| EP | 903885 A2 * | 3/1999 | ........... | H03L 7/0814 |

* cited by examiner

RESISTOR-CAPACITOR OSCILLATION CIRCUIT

RESISTOR-CAPACITOR OSCILLATION CIRCUIT

The present disclosure relates to a technical field of electronics, and in particular to a resistor-capacitor oscillation circuit.

BACKGROUND

Currently, periodically charging and discharging capacitors through resistors is a basic principle of resistor-capacitor (RC) oscillators. When a voltage of the capacitors reaches a certain level, a charging switch of the capacitors is turned off through feedback control, and a discharging switch of the capacitors is further turned on through the feedback control. If there is only one capacitor to be charged and discharged, the feed control is generally performed through a hysteresis comparator. If there are two groups of the capacitors to be charged and discharged, the feedback control is performed through two hysteresis comparators. However, current RC oscillators basically need the hysteresis comparators to determine the level of the voltage of the capacitors and to perform the feedback control on the charging switch and the discharging switch.

Moreover, the way of determining the level of the voltage of the capacitors by the comparators has a problem about a dead state of outputting. For example, if an output node of the comparator comes to an intermediate level due to external force, a whole loop circuit may stop oscillating and enter a steady state; and even though the external force is removed, the loop circuit can still not automatically recover for oscillation. Therefore, it is necessary to provide a recovery circuit with respect to the dead state of outputting for different circuits, which increases circuit areas and power consumption cost, and further increases level of design difficulty.

SUMMARY

The present disclosure aims to overcome at least one of the above technical problems and provides a resistor-capacitor (RC) oscillation circuit.

In order to achieve the above purpose, on one hand, the present disclosure provides the RC oscillation circuit, including a first group of inverters, a second group of inverters, a latch, a delay circuit, and a third group of inverters.

The first group of the inverters is connected to the delay circuit, and is configured to generate a first signal A and a second signal B, and input the first signal A and the second signal B into the delay circuit. A potential of the first signal A is opposite to a potential of the second signal B.

An input end of the second group of the inverters is connected to an enable signal EN. An output end of the second group of the inverters is connected to the latch. The second group of the inverters is configured to generate an inverted signal ENB opposite to the enable signal EN and input the inverted signal ENB into the latch.

An output end of the delay circuit is connected to the latch, and is configured to delay the first signal A and the second signal B and output a first delay signal DA and a second delay signal DB to the latch.

The latch is connected to the third group of the inverters. The latch includes a first output end and a second output end. The latch receives the first delay signal DA and the second delay signal DB. The latch generates a first clock signal FB and a second clock signal FA and receives the first clock signal FB and the second clock signal FA. The first output end is connected to the third group of the inverters and inputs the first clock signal FB to the third group of the inverters. The first output end is further connected to an input end of the first group of the inverters. The first clock signal FB serves as an input of the first group of the inverters.

After the first clock signal FB is driven by the third group of the inverters, an output signal CLK is output by an output end of the third group of the inverters.

Furthermore, the first group of the inverters includes a first inverter and a second inverter connected in series. The first group of the inverters respectively output the first signal A and the second signal B through output ends of the first inverter and the second inverter.

Furthermore, the delay circuit includes a first delay circuit and a second delay circuit. The first delay circuit and the second delay circuit are respectively connected to the output ends of the first inverter and the second inverter.

Furthermore, the latch includes a three-input NOR gate and a two-input NOR gate. An output end of the first delay circuit is connected to a DA input end of the three-input NOR gate. The output end of the second group of the inverters is connected to an ENB input end of the three-input NOR gate. An output end of the two-input NOR gate is connected to an FA input end of the three-input NOR gate.

An FB input end of the two-input NOR gate is connected to an output end of the three-input NOR gate. A DB input end of the two-input NOR gate is connected to an output end of the second delay circuit.

Furthermore, the second group of the inverters includes an odd number of inverters.

Furthermore, a quantity of inverters of the third group of the inverters is determined according to loads to be connected.

Furthermore, a quantity of inverters of the third group of the inverters is determined according to phase of the output signal CLK.

On the other hand, the present disclosure further provides a resistor-capacitor (RC) oscillation circuit, including: a first group of inverters, a latch, a delay circuit, and a third group of inverters.

The first group of the inverters is connected to the delay circuit, and is configured to generate a first signal A and a second signal B, and input the first signal A and the second signal B into the delay circuit. A potential of the first signal A is opposite to a potential of the second signal B.

An output end of the delay circuit is connected to the latch, and is configured to delay the first signal A and the second signal B and output a first delay signal DA and a second delay signal DB to the latch.

An input end of the latch is further connected to an enable signal EN port. An output end of the latch is connected to the third group of the inverters. The latch includes a first output end and a second output end. The latch receives the first delay signal DA and the second delay signal DB. The latch generates a first clock signal FB and a second clock signal FA and receives the first clock signal FB and the second clock signal FA. The first output end is connected to the third group of the inverters and inputs the first clock signal FB to the third group of the inverters. The first output end is further connected to an input end of the first group of the inverters. The first clock signal FB serves as an input of the first group of the inverters.

After the first clock signal FB is driven by the third group of the inverters, an output signal CLK is output by an output end of the third group of the inverters.

Furthermore, the first group of the inverters includes a first inverter and a second inverter connected in series. The first group of the inverters respectively output the first signal A and the second signal B through output ends of the first inverter and the second inverter. The delay circuit includes a first delay circuit and a second delay circuit. The first delay circuit and the second delay circuit are respectively connected to the output ends of the first inverter and the second inverter.

Furthermore, the latch includes a three-input NOR gate and a two-input NOR gate. An output end of the first delay circuit is connected to a DA input end of the three-input NOR gate. The output end of the second group of the inverters is connected to an EN input end of the three-input NOR gate. An output end of the two-input NOR gate is connected to an FA input end of the three-input NOR gate. An FB input end of the two-input NOR gate is connected to an output end of the three-input NOR gate. A DB input end of the two-input NOR gate is connected to an output end of the second delay circuit.

Compared with prior art, in the embodiments of the present disclosure, any node in an RC oscillator is pulled to an abnormal level by an abnormal external force. For example, the RC oscillator is forced to be at a high level or forced to be at a low level, and after the external force is removed, the RC oscillation circuit may automatically recover for oscillation without additionally providing any recovery circuit for a dead state of outputting.

BRIEF DESCRIPTION OF DRAWINGS

In order to more clearly illustrate technical solutions in embodiments of the present disclosure, drawings that need to be used in description of the embodiments are briefly described below. In an obvious way, the drawings in the following description are merely some embodiments of the present disclosure, and for a person of ordinary skill in art, other drawings are obtained according to the drawings without involving any inventive effort, wherein.

DETAILED DESCRIPTION

Technical solutions in embodiments of the present disclosure are clearly and completely described below in conjunction with drawings in the embodiments of the present disclosure, and obviously, the described embodiments are only a part of the embodiments of the present disclosure rather than all embodiments. Based on the embodiments of the present disclosure, all other embodiments obtained by a person of ordinary skill in art without creative efforts shall fall within a protection scope of the present disclosure.

Embodiment 1

Figure 1:
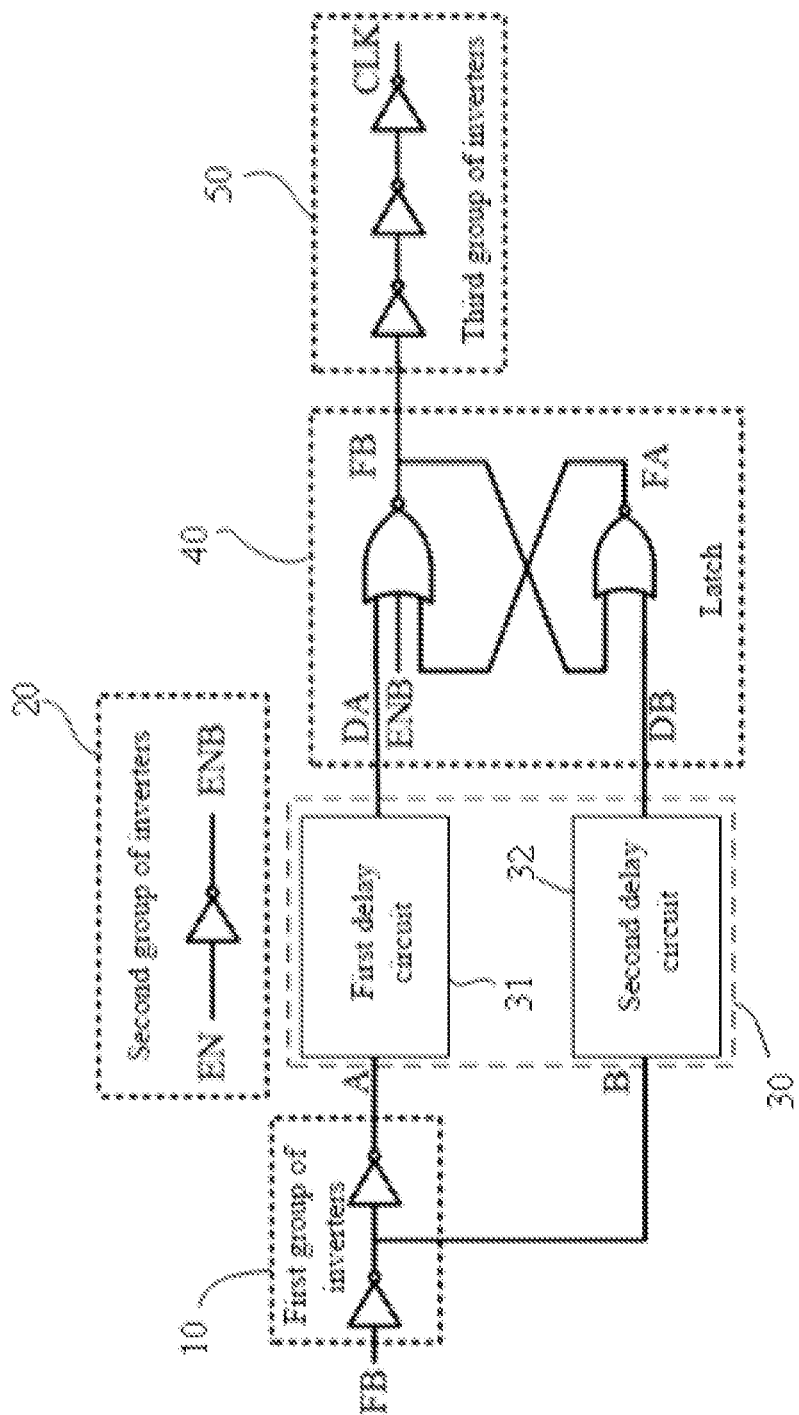
FIG. 1 is a schematic diagram of a resistor-capacitor (RC) oscillation circuit according to one embodiment of the present disclosure.

Referring to FIG. 1, the embodiment of the present disclosure provides a resistor-capacitor (RC) oscillation circuit, including a first group of inverters 10, a second group of inverters 20, a latch 40, a delay circuit 30, and a third group of inverters 50.

The first group of the inverters 10 is connected to the delay circuit 30, and is configured to generate a first signal A and a second signal B, and input the first signal A and the second signal B into the delay circuit 30. A potential of the first signal A is opposite to a potential of the second signal B. An input end of the second group of the inverters 20 is connected to an enable signal EN. An output end of the second group of the inverters 20 is connected to the latch 40. The second group of the inverters 20 is configured to generate an inverted signal ENB opposite to the enable signal EN and input the inverted signal ENB into the latch 40 to control the circuit enable, which is effective for high level. An output end of the delay circuit 30 is connected to the latch 40, and is configured to delay the first signal A and the second signal B and output a first delay signal DA and a second delay signal DB to the latch 40. The latch 40 is connected to the third group of the inverters 50. The latch 40 includes a first output end and a second output end. The latch 40 receives the first delay signal DA and the second delay signal DB. The latch 40 generates a first clock signal FB and a second clock signal FA and receives the first clock signal FB and the second clock signal FA. The first output end is connected to the third group of the inverters 50 and inputs the first clock signal FB to the third group of the inverters 50. The first output end is further connected to an input end of the first group of the inverters 10. The first clock signal FB serves as an input of the first group of the inverters 10, that is, the first clock signal FB is used as a feedback input of the RC oscillation circuit. After the first clock signal FB is driven by the third group of the inverters 50, an output signal CLK is output by an output end of the third group of the inverters 50.

In the embodiment, the first group of the inverters 10 includes a first inverter and a second inverter connected in series. The first group of the inverters 10 respectively output the first signal A and the second signal B through output ends of the first inverter and the second inverter.

In the embodiment, a delay length of the delay circuit 30 is freely adjusted according to duty ratio required by an output clock. The delay circuit 30 includes a first delay circuit 31 and a second delay circuit 32. The first delay circuit 31 and the second delay circuit 32 are respectively connected to the output ends of the first inverter and the second inverter, receive the input first signal A and the input second signal B, and respectively perform delay processing on the first signal A and the second signal B. The first delay circuit 31 performs delay processing on the first signal A and then outputs the first delay signal DA. The second delay circuit 32 performs delay processing on the second signal B and then outputs the second delay signal DB.

In the embodiment, the latch 40 includes a three-input NOR gate and a two-input NOR gate. An output end of the first delay circuit 31 is connected to a DA input end of the three-input NOR gate, which is configured to input the first delay signal DA. The output end of the second group of the inverters is connected to an ENB input end of the three-input NOR gate, which is configured to input the inverted signal ENB. An output end of the two-input NOR gate is connected to an FA input end of the three-input NOR gate, and the second clock signal FA output by an input NOT gate is used as an input of the FA input end of the three-input NOR gate.

An FB input end of the two-input NOR gate is connected to an output end of the three-input NOR gate, which is configured to receive the first clock signal FB output by the three-input NOR gate. A DB input end of the two-input NOR gate is connected to an output end of the second delay circuit, which is configured to receive the second delay signal output by the second delay circuit 32.

The latch 40 outputs switching of the first clock signal FB according to a high level of the DA input end and a high level of the DB input end, and latches and holds the first clock signal FB before next high level arrives, and an enable signal EN of the first clock signal FB is effective at a low level.

Figure 2:
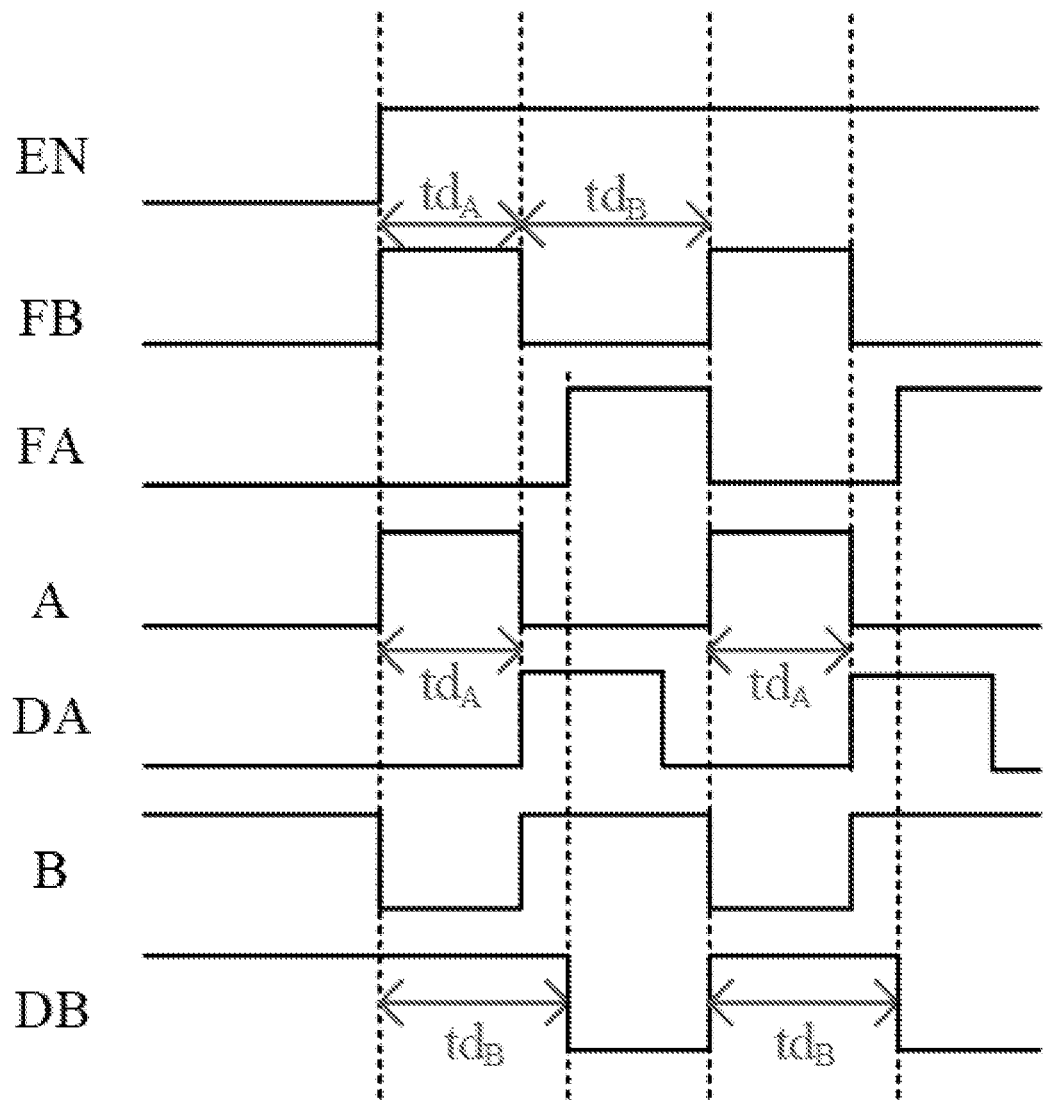
FIG. 2 is a timing schematic diagram of the RC oscillation circuit according to one embodiment of the present disclosure.

As shown in FIG. 2, the first clock signal FB generates a falling edge that is controlled and generated by a rising edge of the first delay signal DA. The rising edge of the first clock signal FB is triggered by the falling edge generated after the second clock signal FA and the first delay signal DA. An order of the falling edge of the second clock signal FA and the falling edge of the first delay signal DA is determined by sizes of delay time tdA and delay time tdB of the delay circuit. The second clock signal FA generates a falling edge that is controlled and generated by a rising edge of the second delay signal DB. The rising edge of the second clock signal FA is triggered by the falling edge generated after the first clock signal FB and the second delay signal DB. An order of the falling edge of the first clock signal FB and the falling edge of the second delay signal DB is determined by the sizes of the delay time tdA and the delay time tdB of the delay circuit.

In the embodiment, the duty ratio of the output signal CLK is the delay time tdA of the first delay circuit. A period of the output signal CLK is sum of a delay time of the first delay circuit and a delay time of the second delay circuit, namely tdA+tdB.

In the embodiment, the second group of the inverters 20 includes an odd number of inverters, and specifically includes one inverter, which is configured to generate the inverted signal ENB opposite to the enable signal EN.

In one embodiment, a quantity of inverters of the third group of the inverters 50 is determined according to loads to be connected.

In another embodiment, a quantity of inverters of the third group of the inverters 50 is determined according to phase of the output signal CLK.

Any nodes of EN, ENB, A, B, DA, DB, FA, and FB in an RC oscillator is pulled to an abnormal level by an abnormal external force, for example, the RC oscillator is forced to be at a high level or forced to be at a low level, and after the external force is removed, the RC oscillation circuit may automatically recover for oscillation without additionally providing any recovery circuit for a dead state of outputting. For example, it is assumed that the first clock signal FB is at a low level, at this time, the second signal B is at a high level, the first signal A is at a low level, and after the second signal B and the first signal A are delayed, the first clock signal FB should be turned to a high level. At this time, the first signal A is pulled to a high level through strong external force, the first delay signal DA is pulled to a high level after passing through the delay circuit, the first clock signal FB is kept at a low level, and the circuit stops oscillating. After the strong external force is removed, due to a fact that the first clock signal FB is at a low level, the first signal A is pulled to the low level again, the circuit recovers to a normal working state, and the oscillation is restarted. Other nodes may further be analyzed by a same method.

Embodiment 2

Figure 3:
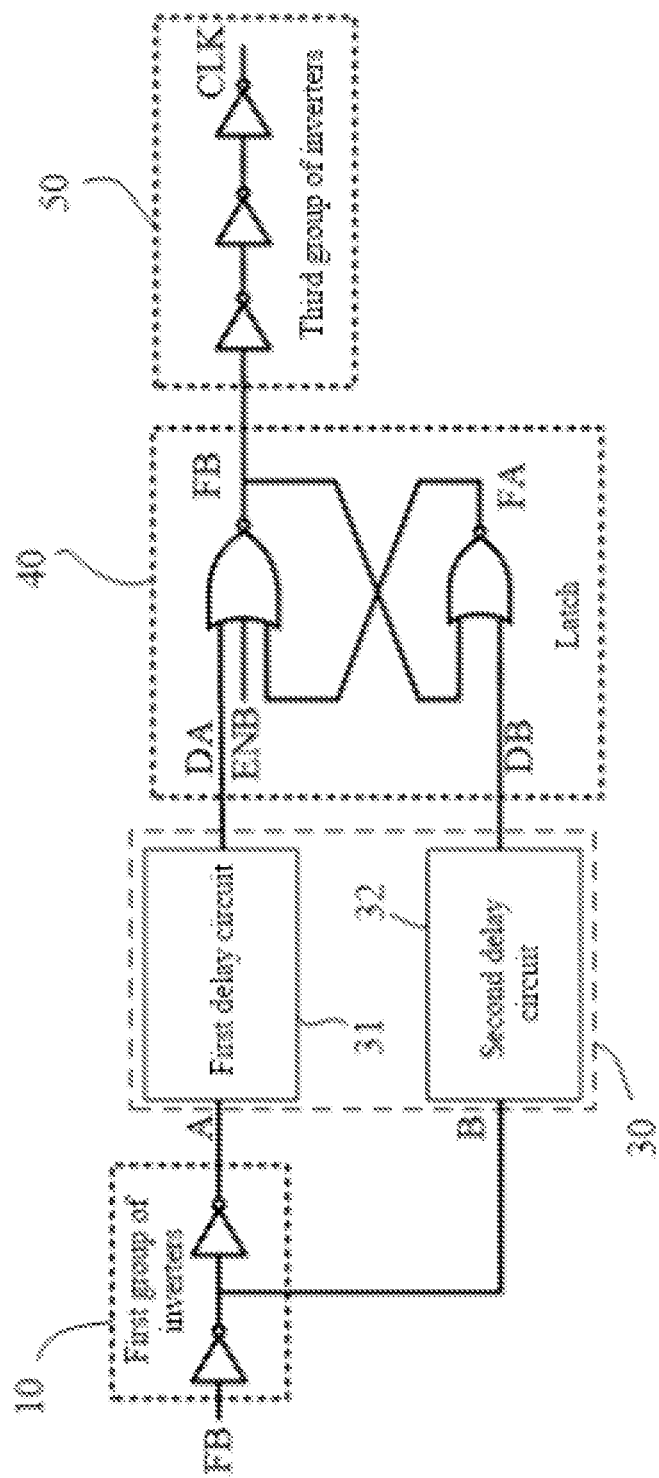
FIG. 3 is a schematic diagram of the RC oscillation circuit according to another embodiment of the present disclosure.

Referring to FIG. 3, the embodiment of the present disclosure provides a resistor-capacitor (RC) oscillation circuit. Different from Embodiment 1, in the embodiment, an enable signal EN is effective at a low level, at this time, the enable signal is directly connected to an ENB port of a latch, and there is no need to provide the second group of the inverters.

The above is only embodiments of the present disclosure, and it should be noted that, for a person of ordinary skill in the art, improvement is made without departing from a concept of the present disclosure, but these are all within the protection scope of the present disclosure.

What is claimed is:

1. A resistor-capacitor (RC) oscillation circuit, comprising:
   a first group of inverters;
   a second group of inverters;
   a latch;
   a delay circuit; and
   a third group of inverters;
   wherein the first group of the inverters is connected to the delay circuit, and is configured to generate a first signal A and a second signal B, and input the first signal A and the second signal B into the delay circuit, a potential of the first signal A is opposite to a potential of the second signal B;
   an input end of the second group of the inverters is connected to an enable signal EN, an output end of the second group of the inverters is connected to the latch, and the second group of the inverters is configured to generate an inverted signal ENB opposite to the enable signal EN and input the inverted signal ENB into the latch;
   an output end of the delay circuit is connected to the latch, and is configured to delay the first signal A and the second signal B and output a first delay signal DA and a second delay signal DB to the latch;
   the latch is connected to the third group of the inverters, the latch comprises a first output end and a second output end, the latch receives the first delay signal DA and the second delay signal DB, the latch generates a first clock signal FB and a second clock signal FA and receives the first clock signal FB and the second clock signal FA; the first output end is connected to the third group of the inverters and inputs the first clock signal FB to the third group of the inverters; the first output end is further connected to an input end of the first group of the inverters, the first clock signal FB serves as an input of the first group of the inverters; and
   after the first clock signal FB is driven by the third group of the inverters, an output signal CLK is output by an output end of the third group of the inverters.

2. The RC oscillation circuit according to claim 1, wherein the first group of the inverters comprises a first inverter and a second inverter connected in series, and the first group of the inverters respectively output the first signal A and the second signal B through output ends of the first inverter and the second inverter.

3. The RC oscillation circuit according to claim 2, wherein the delay circuit comprises a first delay circuit and a second delay circuit, and the first delay circuit and the second delay circuit are respectively connected to the output ends of the first inverter and the second inverter.

4. The RC oscillation circuit according to claim 3, wherein the latch comprises a three-input NOR gate and a two-input NOR gate, an output end of the first delay circuit is connected to a DA input end of the three-input NOR gate, the output end of the second group of the inverters is connected to an ENB input end of the three-input NOR gate, an output end of the two-input NOR gate is connected to an FA input end of the three-input NOR gate; and an FB input end of the two-input NOR gate is connected to an output end of the three-input NOR gate, and a DB input end of the two-input NOR gate is connected to an output end of the second delay circuit.

5. The RC oscillation circuit according to claim 1, wherein the second group of the inverters comprises an odd number of inverters.

6. The RC oscillation circuit according to claim 1, wherein a quantity of inverters of the third group of the inverters is determined according to loads to be connected.

7. The RC oscillation circuit according to claim 1, wherein a quantity of inverters of the third group of the inverters is determined according to phase of the output signal CLK.

8. A resistor-capacitor (RC) oscillation circuit, comprising:
a first group of inverters;
a latch;
a delay circuit; and
a third group of inverters;
wherein the first group of the inverters is connected to the delay circuit, the first group of the inverters is configured to generate a first signal A and a second signal B and input the first signal A and the second signal B into the delay circuit, and a potential of the first signal A is opposite to a potential of the second signal B;
an output end of the delay circuit is connected to the latch, and is configured to delay the first signal A and the second signal B and output a first delay signal DA and a second delay signal DB to the latch;
an input end of the latch is further connected to an enable signal EN port, an output end the latch is connected to the third group of the inverters, the latch comprises a first output end and a second output end, the latch receives the first delay signal DA and the second delay signal DB, the latch generates a first clock signal FB and a second clock signal FA and receives the first clock signal FB and the second clock signal FA; the first output end is connected to the third group of the inverters and inputs the first clock signal FB to the third group of the inverters; the first output end is further connected to an input end of the first group of the inverters, the first clock signal FB serves as an input of the first group of the inverters; and
after the first clock signal FB is driven by the third group of the inverters, an output signal CLK is output by an output end of the third group of the inverters.

9. The RC oscillation circuit according to claim 8, wherein the first group of the inverters comprises a first inverter and a second inverter connected in series, the first group of the inverters respectively output the first signal A and the second signal B through output ends of the first inverter and the second inverter, the delay circuit comprises a first delay circuit and a second delay circuit, and the first delay circuit and the second delay circuit are respectively connected to the output ends of the first inverter and the second inverter.

10. The RC oscillation circuit according to claim 9, wherein the latch comprises a three-input NOR gate and a two-input NOR gate, an output end of the first delay circuit is connected to a DA input end of the three-input NOR gate, the enable signal EN port is connected to an ENB input end of the three-input NOR gate, an output end of the two-input NOR gate is connected to an FA input end of the three-input NOR gate; and an FB input end of the two-input NOR gate is connected to an output end of the three-input NOR gate, and a DB input end of the two-input NOR gate is connected to an output end of the second delay circuit.

\* \* \* \* \*